US008165856B1

(12) United States Patent
Goel (10) Patent No.: US 8,165,856 B1
(45) Date of Patent: Apr. 24, 2012

(54) NEIGHBORHOOD DETERMINATION METHODS AND SYSTEMS IN COMPUTER AIDED ENGINEERING ANALYSIS

(75) Inventor: Tushar Goel, Livermore, CA (US)

(73) Assignee: Livermore Software Technology Corporation, Livermore, CA (US)

( * ) Notice: Subject to any disclaimer, the term of this patent is extended or adjusted under 35 U.S.C. 154(b) by 492 days.

(21) Appl. No.: 12/498,180

(22) Filed: Jul. 6, 2009

Related U.S. Application Data

(60) Provisional application No. 61/174,776, filed on May 1, 2009.

(51) Int. Cl.
*G06F 7/60* (2006.01)
*G06F 17/10* (2006.01)
(52) U.S. Cl. .......................................................... 703/2
(58) Field of Classification Search ........................ None
See application file for complete search history.

(56) References Cited

U.S. PATENT DOCUMENTS

2003/0052875 A1 * 3/2003 Salomie ........................ 345/419
* cited by examiner

*Primary Examiner* — David Silver
(74) *Attorney, Agent, or Firm* — Roger H. Chu (57) ABSTRACT

Improved methods and systems for a neighborhood determination in computer aided engineering analysis are disclosed. According to one aspect, a list of neighbor elements is created for a base element of a grid model representing a structure or an engineering product. The representative node's coordinates of the base element are calculated using corner nodes of the base element. A characteristic length is assigned to the base element. The characteristic length can be determined by users of the computer aided analysis, or be calculated using geometry of the base element. The characteristic length and the representative node collectively define a surface boundary that divides elements in the grid model into two groups. The first group contains potential neighbors, while the second group contains non-neighbors. Only elements in the first group are further processed using traditional procedures to determine whether each of them is indeed a neighbor element according to one of the neighborhood determination criteria.

15 Claims, 8 Drawing Sheets

NEIGHBORHOOD DETERMINATION METHODS AND SYSTEMS IN COMPUTER AIDED ENGINEERING ANALYSIS

CROSS REFERENCE TO RELATED APPLICATIONS

This application claims priority from a U.S. Provisional Patent Application Ser. No. 61/174,776 filed May 1, 2009, the entire contents of which are incorporated herein by reference.

FIELD OF THE INVENTION

The present invention generally relates to computer aided engineering analysis (e.g., finite element analysis, topology optimization, etc.), more particularly to improved neighborhood determination methods and systems for a grid model (e.g., finite element mesh) used in computer aided engineering analysis.

BACKGROUND OF THE INVENTION

Today, computer aided engineering (CAE) has been used for supporting engineers in tasks such as analysis, simulation, design, manufacture, etc. In conventional engineering design procedures, CAE analysis (e.g., finite element analysis (FEA), finite difference analysis, computational fluid dynamics (CFD) analysis, modal analysis for reducing noise-vibration-harshness (NVH), etc.) has been employed to evaluate responses (e.g., stresses, displacements, etc.). Generally, a body or structure (i.e., engineering product) is represented by an assemblage of subdivisions called elements (e.g., finite elements) that are interconnected at joints or nodes in the computer aided engineering analysis. Finite elements and interconnected nodes are collectively referred to as a grid model.

In order to perform design optimization, automated computer-implemented procedures that incorporate CAE have also become ever popular. For conceptual designs, topology optimization is a very popular engineering optimization methods. Topology optimization requires complex interactions among loading and boundary conditions, material models, geometry and grid model (e.g., finite element mesh) of the design components. These interactions at times can destabilize engineering simulation (i.e., computer aided engineering analysis), particularly in the presence of non-linear structural behaviors of the engineer product to be optimized. One of the problems is that significant sudden changes of material distribution could cause numerical instability in topology optimization. To reduce this instability, local averaging of the design variables is used for protecting against sudden variations in the material distribution and/or redistribution.

In general, local averaging is conducted by averaging results of a group of neighbor elements within a neighborhood of an element. Identifying neighbors of each element in a large complex grid model could be a time consuming task even with the state-of-the-art multi-processor computer system. Traditionally, neighbors of an element are identified by comparing every nodal point of a pair of elements to determine whether there is a shared node, or by computing the distance of the two elements to determine whether they are within a threshold. Either of these prior art approaches requires a significant amount of computations. For example, comparing each node of one element against every node of another element requires number of comparison operations in the order of number of nodes squared, while computing spatial distance of two elements requires a computation of square root for each pair. When a grid model containing large number of elements (e.g., one million or more), the prior art approaches of locating neighbors become prohibitively expensive both in terms of time and cost (i.e., takes sometimes hours). Therefore, it would be desirable to have improved neighborhood determination methods and systems in computer aided engineering analysis.

BRIEF SUMMARY OF THE INVENTION

This section is for the purpose of summarizing some aspects of the present invention and to briefly introduce some preferred embodiments. Simplifications or omissions in this section as well as in the abstract and the title herein may be made to avoid obscuring the purpose of the section. Such simplifications or omissions are not intended to limit the scope of the present invention.

The present invention discloses improved methods and systems for a neighborhood determination of an element of a grid model used in computer aided engineering analysis. The neighborhood determination method is the same for each element of the grid model. In order to describe the method in a clearer non-confusing manner, a term, base element, is used herein for referencing the method being applied to a particular element. According to one aspect of the present invention, a list of neighbor elements is created for a base element in a grid model representing a structure or an engineering product. First, a representative node's (e.g., the centroid's) coordinates of the base element are calculated using corner nodes of the base element in a three-dimensional coordinate system (e.g., Cartesian coordinate system). A characteristic length is assigned to the base element. The characteristic length can either be determined by users of the computer aided analysis, or be calculated using geometry of the base element (e.g., size of the element) or some metric of the grid model (e.g., dimension). The characteristic length and the centroid collectively define a region of potential neighbors, for example, a cubic space centered at the base element's centroid having its side dimension as the characteristic length or a sphere having its radius as the characteristic length with center at the base element's centroid. The surface boundary divides elements in the grid model into first and second groups. The first group contains those elements located within the surface boundary as potential neighbors, while the second group contains elements outside as non-neighbors. Only elements in the first group are further processed using traditional procedures to determine whether each of them is indeed a neighbor element according to one of the neighborhood determination criteria, for example, sharing at least one common node with the base element, or locating within a threshold distance from the centroid of the base element, dividing elements in the grid model into the first and second groups is accomplished by comparing coordinates of every element's centroid with respective upper and lower bounds in each dimension (e.g., two for two-dimension, three for three-dimension). The upper and lower bounds can be established by adding and subtracting characteristic length from the base element's centroid coordinates.

According to yet another aspect, elements in the grid model are sorted into three ordered list in respective dimension, such that division of the first and second groups can be efficiently achieved by searching the pre-sorted or ordered list and locating elements whose coordinates correspond to the upper and lower bounds.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description, appended claims, and accompanying drawings as follows:

DETAILED DESCRIPTION

In the following description, numerous specific details are set forth in order to provide a thorough understanding of the present invention. However, it will become obvious to those skilled in the art that the present invention may be practiced without these specific details. The descriptions and representations herein are the common means used by those experienced or skilled in the art to most effectively convey the substance of their work to others skilled in the art. In other instances, well-known methods, procedures, components, and circuitry have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Embodiments of the present invention are discussed herein with reference to FIGS. 1-7. However, those skilled in the art will readily appreciate that the detailed description given herein with respect to these figures is for explanatory purposes as the invention extends beyond these limited embodiments.

Figure 1:
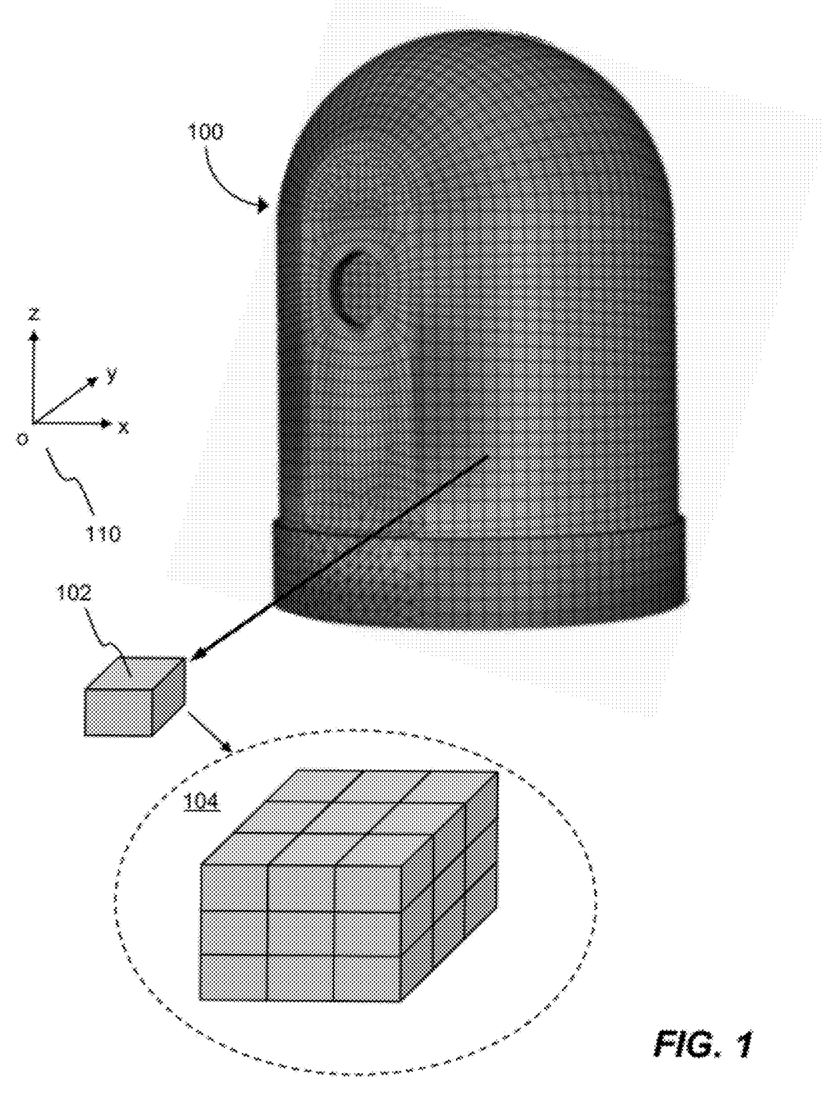
FIG. 1 is a diagram showing an exemplary grid model in which one embodiment of the present invention can be used for determining neighborhood of an element contained therein.

An exemplary grid model 100 is shown in FIG. 1. The grid model 100 is generally defined in a coordinate system (e.g., Cartesian coordinate system 110). The grid model 100 comprises a plurality of elements 102. Each element along with its neighbor elements forms a neighborhood 104. The present invention directs to improved methods and systems for determining such neighborhood in an efficient manner, which is critical in a substantially large grid model (e.g., 1,000,000 or more elements) representing very complex structure or body (e.g., an automobile, an airplane or their complicated components).

Figure 2:
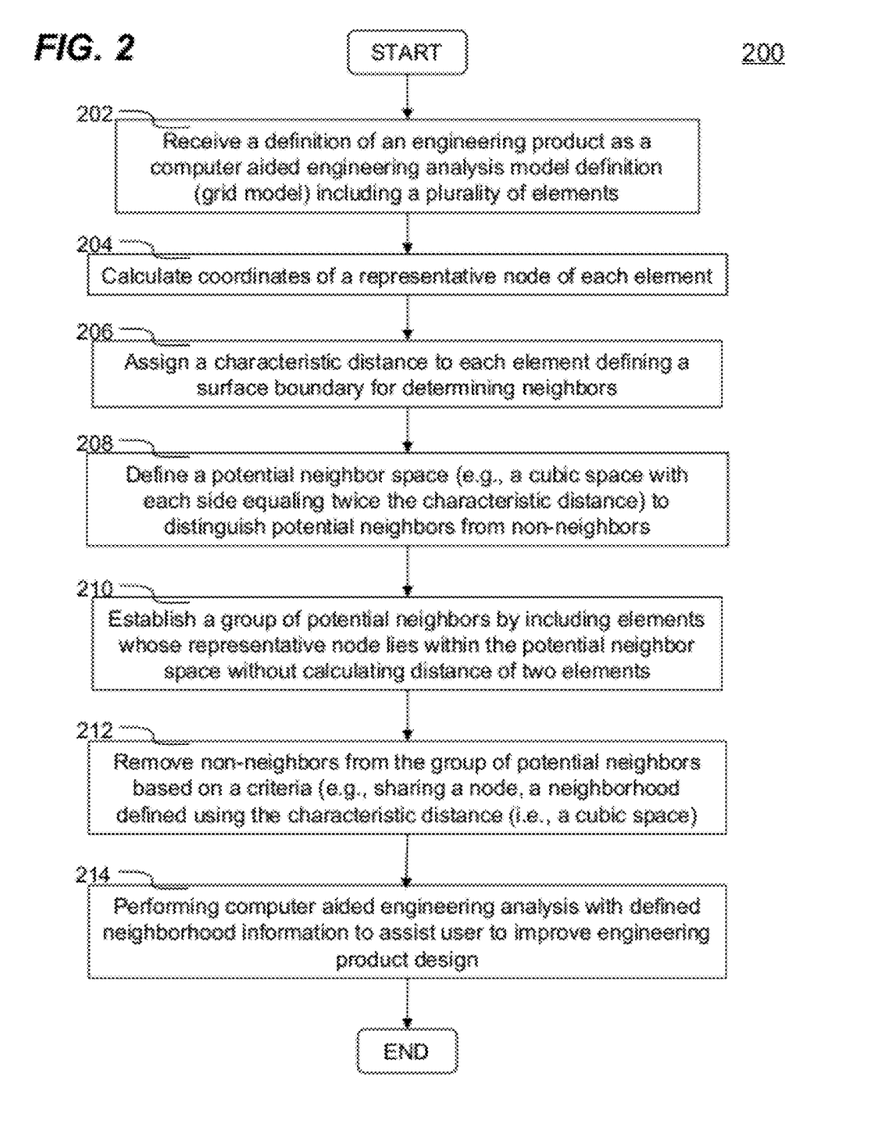
FIGS. 2A-2B collectively are a flowchart illustrating an exemplary process of determining a list of neighbor elements of a base element in a grid model, according to an embodiment of the present invention.
Figure 2B:
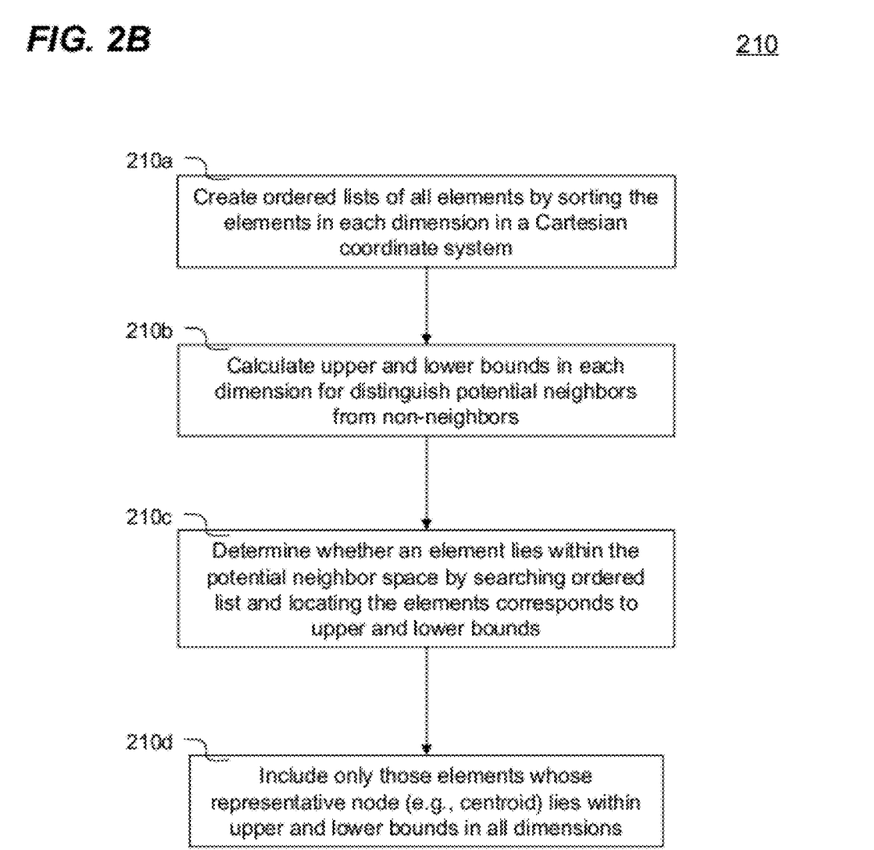

According to one embodiment of the present invention, an exemplary process 200 of determining a list of neighbor elements of a base element of a grid model is shown collectively in FIGS. 2A-B. Process 200 is preferably implemented in software and understood with following figures especially FIGS. 3A-6. The grid model along with the neighborhood information of each element is used in an engineering simulation (e.g., computer aided engineering analysis) to assist users (i.e., engineers and scientists) in improving engineering structure or product design (e.g., numerically simulating and approximating engineering structure responses would otherwise nearly impractical to obtain).

Process 200 starts by receiving a definition of an engineering product in a computer system at step 202. The definition includes a computer aided engineering analysis model, for example, a grid model which comprises a plurality of elements (e.g., finite element mesh representing an engineering product).

Next, at step 204, coordinates of a representative node (e.g., the centroid) of each element (e.g., a base element) are calculated. The representative node's coordinates can be derived from its corner nodes. For example, the coordinates of the centroid of a hexahedral element (i.e., brick element or solid element) is calculated as a simple average of coordinates of all eight corner nodes. And at step 206, each element is assigned a characteristic length, which can be determined either by user definition or by an automated computation procedure. The automated computation procedure comprises estimating the characteristic length as a multiple/fraction of a particular metric of the grid model, for example, average size of the elements in the grid model, a fraction of total dimension of the grid model, etc. In one embodiment, the computation procedure comprises calculating an average element size or dimension from its geometry (i.e., corner nodes), then assigning a multiple (e.g., two times) of the average element size as the characteristic length. The characteristic length is configured to define a surface boundary that separates potential neighbors from non-neighbors for each element. The neighborhood determination method is the same for each element in the grid model.

At step 208, a potential neighbor space is established. The potential neighbor space, in one example, is a cubic space having each side equaling twice the characteristic length centered at the centroid of the base element shown in FIG. 3A. The potential neighbor space can also be a sphere having a radius equaling the characteristic length centered at the centroid of the base element shown in FIG. 3B. For illustration simplicity, both FIG. 3A and FIG. 3B are shown in two dimensions.

Figure 3A:
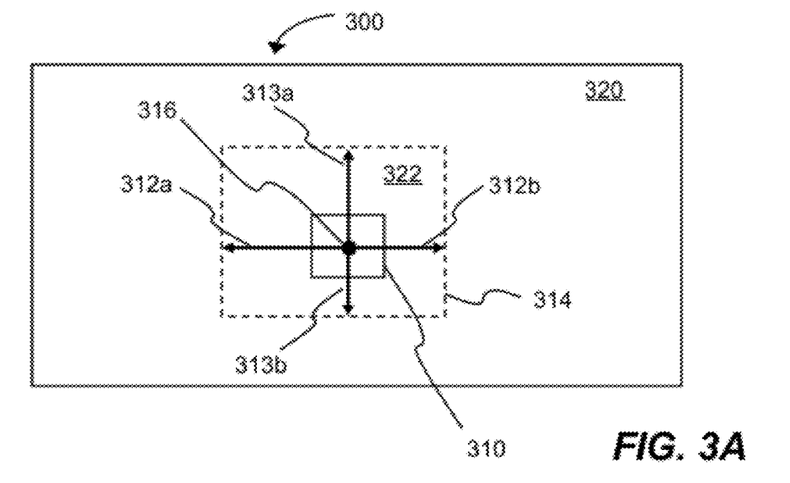
FIG. 3A is a two-dimensional view showing an element and its associated exemplary characteristic length with which a region of potential neighbors is defined, according to an embodiment of the present invention.

Referring now to FIG. 3A, it is shown a grid model (shown as a rectangular domain 300 and no element details) divided into two regions 320-322 by a rectangle 314-projection of a surface boundary defined by a cubic space centered at the centroid 316 (i.e., a representative node) of the base element 310. The characteristic length can be represented by two pair of ranges 312a-b-313a-b in each of the dimensions. The region within the rectangle 314 (i.e., a cross-section of the cubic space) is the potential neighbor space 322, while the region (outside the rectangle 314) is non-neighbor space 320.

Figure 3B:
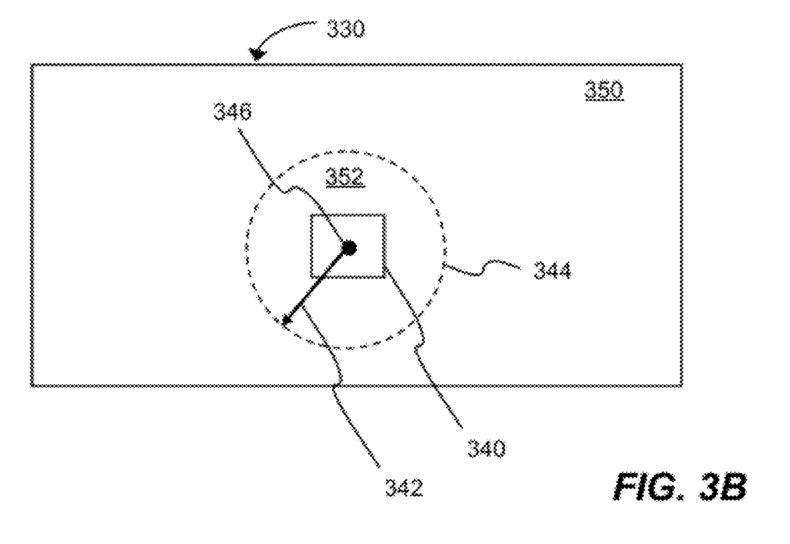
FIG. 3B is a two-dimensional view showing another element with its associated exemplary characteristic length with which a region of potential neighbors is defined, according to another embodiment of the present invention.

Similarly, FIG. 3B shows a grid model (shown as a rectangular domain 330 and no element details) divided into two regions 350-352 by a circle 344-projection of a surface boundary defined by a sphere having a radius 342 centered at the centroid 346 of the base element 340. The radius 342 is the characteristic length. The region within the circle 344 (i.e., a cross-section of the sphere) is the potential neighbor space 352, while the region (outside the circle 344) is non-neighbor space 350.

Figure 4A:
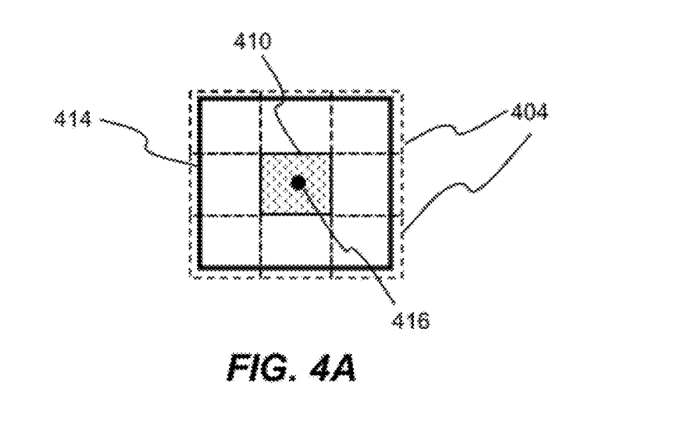
FIGS. 4A and 4B are two detailed two-dimensional views showing exemplary base element, its characteristic length and neighbors, according to embodiments of the present invention.
Figure 4B:
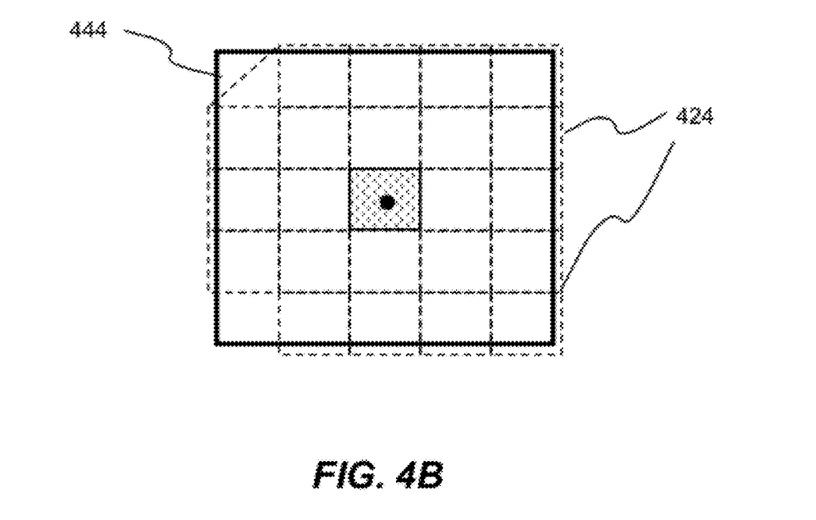

Further details are shown in FIGS. 4A-4B. In FIG. 4A, centroid 416 of the base element 410 together with the characteristic length (e.g., one half of side length) defines a boundary 414. Potential neighbor elements 404 (shown in dotted lines) are those elements surrounding the base element 410. FIG. 4B shows another example similar to the example shown in FIG. 4A except there are more potential neighbors 424 (dotted lines) determined by the boundary 444.

Figure 5A:
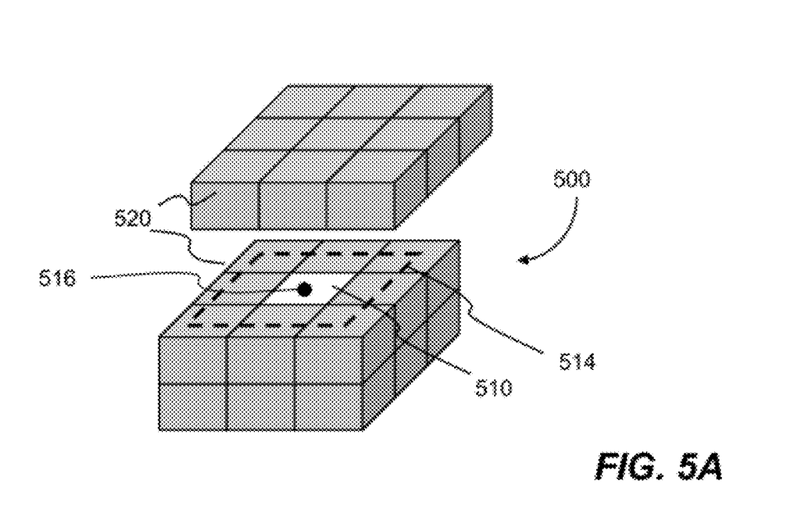
FIGS. 5A and 5B are two exploded three-dimensional perspective views showing an exemplary base element, its characteristic length and neighbors, according to an embodiment of the present invention.
Figure 5B:
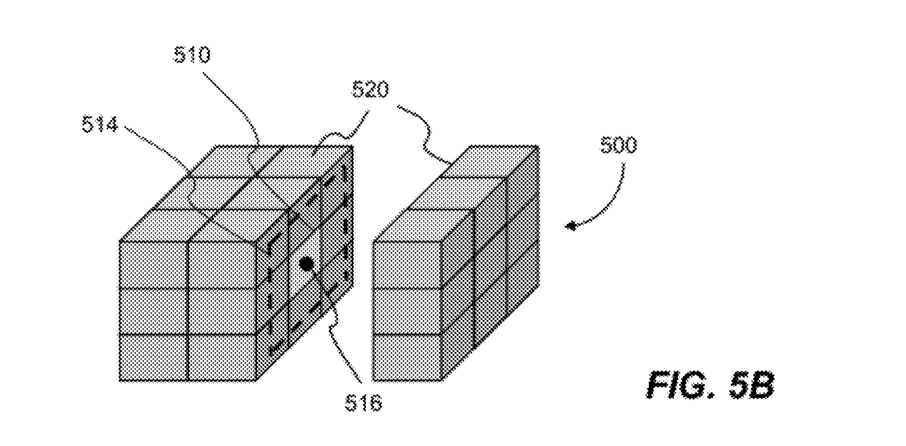

For illustration simplicity and ease of visualization, both FIGS. 3A-B and 4A-B are shown in two dimensions. Those of ordinary skill in art would know the examples shown in FIGS. 3A-B and 4A-B can be extended to three-dimensional as shown in FIGS. 5A-5B. There are shown two exploded perspective views of a neighborhood 500 of a base element 510 (shown in white or lighter color). The base element 510 has a centroid 516 (a representative node) and assigned a characteristic length to form a surface boundary 514 (i.e., the surface of a cubic space defined by the representative node and characteristic length). Neighbor elements 520 (shown in darker color) are those elements surrounding the base element 510.

Referring back to FIG. 2A, process 200 moves to step 210, in which a group of potential neighbor elements for the base element is established. This can be done by excluding elements whose centroid lies outside the potential neighbor space without calculating the distance between each element and the base element. It is noted that calculation of the distance of two elements is expensive in terms of computer resources. More details of step 210 are shown in FIG. 2B and associated descriptions below.

Next, at step 212, process 200 determines which element in the group of potential neighbor elements is indeed a neighbor element to the base element in accordance with a neighborhood definition criterion. In one example, an element is a neighbor element of the base element if there is at least one shared node between them. In another example, an element is a neighbor element if the distance of two elements (e.g., centroid-to-centroid distance) is less than the characteristic length. Finally, at step 214, a computer aided engineering analysis can be performed to simulate structural behaviors using the grid model together with the determined neighborhood information (i.e., the list of neighbor elements for each base element). The engineering simulation results (i.e., structural behaviors or responses) can be used for assisting users to make decision in improvement of an engineering structure/product design. Process 200 ends thereafter.

According to one embodiment, further details of step 210 of process 200 are shown in FIG. 2B. First at step 210a, ordered lists of all elements in the grid model are created by sorting the elements in each dimension of the coordinate system. Three such exemplary lists 610a-c are created and shown in FIG. 6 for respective dimensions (i.e., x-, y- and z-dimension) of a three-dimensional coordinate system (e.g., Cartesian coordinate system 110 of FIG. 1). Each of the lists 610a-c includes two columns: element ID 611a and respective x-, y- or z-coordinate 612a-c. The lists 610a-c can be sorted either in ascending (shown) or descending order in each of the coordinates. Upper 622a-c and lower bounds 621a-c in each coordinate are then determined from the representative node of the base element and the assigned characteristic length ar step 210b. For example, the upper bound of the x-coordinate can be calculated by adding a characteristic length to the x-coordinate of the base element's representative node's x-coordinate, while the lower bound by subtracting the characteristic length from the representative node.

Figure 6:
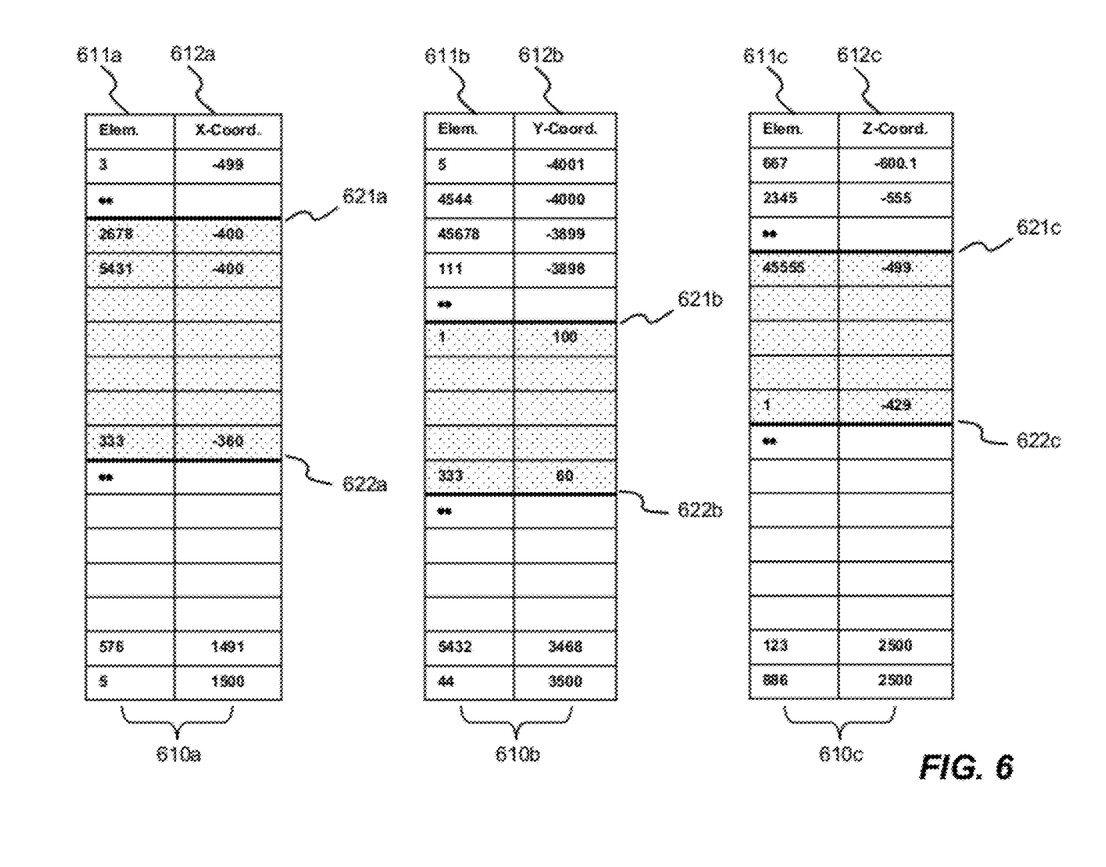
FIG. 6 is a diagram showing three ordered list of elements with respective upper and lower bounds to dividing potential neighbors from non-neighbors of the base element, according to an embodiment of the present invention.

Once the upper and lower bounds are calculated and ordered lists are created, process 200 can determine whether an element lies within the potential neighbor space (i.e., between upper and lower bounds) with a rather straight forward searching and comparing coordinates at step 210c. In one embodiment, bi-section search is carried out on all three ordered lists 610a-c. There is no need to do any distance calculations which can require substantial computer resources especially dealing with huge grid model. The final step 210d is to create the group of potential neighbors by including only those elements located within the upper and lower bounds of all three dimensions. To efficiently accomplish step 210d, bi-section search can be used to determine whether each element is located within the potential neighbor space.

It is noted that bi-section search is one of the most efficient search schemes for an ordered samples such as pre-sorted or ordered list of elements. Other technique can also be employed to increase efficiency. For example, an array of indicators is created having a one-to-one correspondence between the indicator and the element. In one embodiment, the array of indicators is set to zero initially. Then a particular indicator is incremented when corresponding element is determined to be located within the potential region with respect to one of the three dimensions. At the end, potential neighbors are those elements with their respective indicators equal to three for 3-dimensional cases. In another embodiment, the indicator may be preset to another value and then incremented or decremented thereafter to achieve the same.

Figure 7:
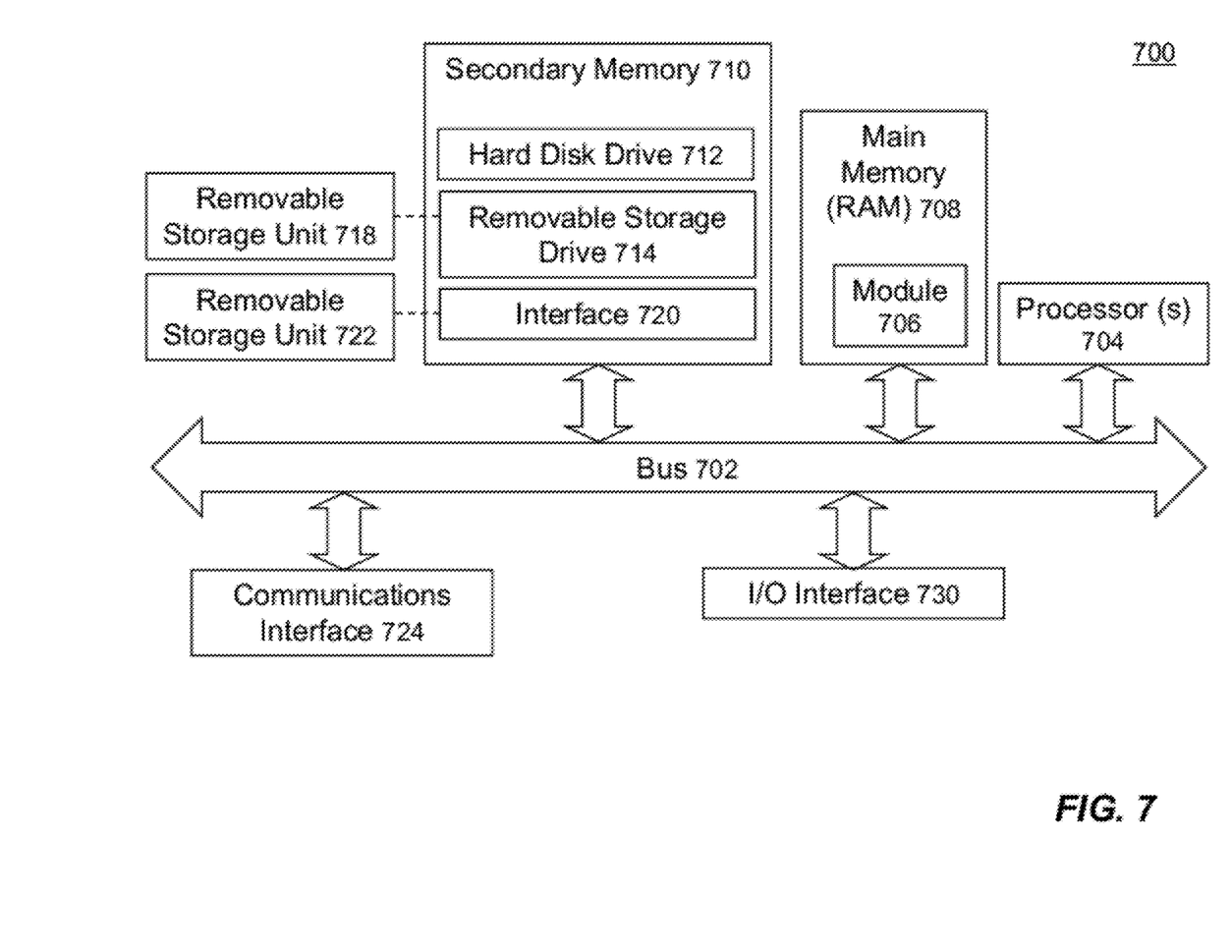
FIG. 7 is a function diagram showing salient components of a computing device, in which an embodiment of the present invention may be implemented.

According to one aspect, the present invention is directed towards one or more computer systems capable of carrying out the functionality described herein. An example of a computer system 700 is shown in FIG. 7. The computer system 700 includes one or more processors, such as processor 704. The processor 704 is connected to a computer system internal communication bus 702. Various software embodiments are described in terms of this exemplary computer system. After reading this description, it will become apparent to a person skilled in the relevant art(s) how to implement the invention using other computer systems and/or computer architectures.

Computer system 700 also includes a main memory 708, preferably random access memory (RAM), and may also include a secondary memory 710. The secondary memory 710 may include, for example, one or more hard disk drives 712 and/or one or more removable storage drives 714, representing a floppy disk drive, a magnetic tape drive, an optical disk drive, etc. The removable storage drive 714 reads from and/or writes to a removable storage unit 718 in a well-known manner. Removable storage unit 718, represents a floppy disk, magnetic tape, optical disk, etc. which is read by and written to by removable storage drive 714. As will be appreciated, the removable storage unit 718 includes a computer usable storage medium having stored therein computer software and/or data.

In alternative embodiments, secondary memory 710 may include other similar means for allowing computer programs or other instructions to be loaded into computer system 700. Such means may include, for example, a removable storage unit 722 and an interface 720. Examples of such may include a program cartridge and cartridge interface (such as that found in video game devices), a removable memory chip (such as an Erasable Programmable Read-Only Memory (EPROM), Universal Serial Bus (USB) flash memory, or PROM) and associated socket, and other removable storage units 722 and interfaces 720 which allow software and data to be transferred from the removable storage unit 722 to computer system 700. In general, Computer system 700 is controlled and coordinated by operating system (OS) software, which performs tasks such as process scheduling, memory management, networking and I/O services.

There may also be a communications interface 724 connecting to the bus 702. Communications interface 724 allows software and data to be transferred between computer system 700 and external devices. Examples of communications interface 724 may include a modem, a network interface (such as an Ethernet card), a communications port, a Personal Computer Memory Card International Association (PCMCIA) slot and card, etc.

The computer 700 communicates with other computing devices over a data network based on a special set of rules (i.e., a protocol). One of the common protocols is TCP/IP (Transmission Control Protocol/Internet Protocol) commonly used in the Internet. In general, the communication interface 724 manages the assembling of a data file into smaller packets that are transmitted over the data network or reassembles received packets into the original data file. In addition, the communication interface 724 handles the address part of each packet so that it gets to the right destination or intercepts packets destined for the computer 700.

In this document, the terms "computer program medium" and "computer recordable storage medium" are used to generally refer to media such as removable storage drive 714, and/or a hard disk installed in hard disk drive 712. These computer program products are means for providing software to computer system 700. The invention is directed to such computer program products.

The computer system 700 may also include an input/output (I/O) interface 730, which provides the computer system 700 to access monitor, keyboard, mouse, printer, scanner, plotter, and alike.

Computer programs (also called computer control logic) are stored as application modules 706 in main memory 708 and/or secondary memory 710. Computer programs may also be received via communications interface 724. Such computer programs, when executed, enable the computer system 700 to perform the features of the present invention as discussed herein. In particular, the computer programs, when executed, enable the processor 704 to perform features of the present invention. Accordingly, such computer programs represent controllers of the computer system 700.

In an embodiment where the invention is implemented using software, the software may be stored in a computer program product and loaded into computer system 700 using removable storage drive 714, hard drive 712, or communications interface 724. The application module 706, when executed by the processor 704, causes the processor 704 to perform the functions of the invention as described herein.

The main memory 708 may be loaded with one or more application modules 706 that can be executed by one or more processors 704 with or without a user input through the I/O interface 730 to achieve desired tasks. In operation, when at least one processor 704 executes one of the application modules 706, the results are computed and stored in the secondary memory 710 (i.e., hard disk drive 712). The status of the CAE analysis or topology optimization (e.g., list of neighbor elements can be displayed in a table, potential neighbors and non-neighbor can be shown with different colors, a grid model can be displayed in any desired perspective views, etc.) is reported to the user via the I/O interface 730 either in a text or in a graphical representation.

Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas solid hexahedral elements have been described and shown, other types of finite element can be used (e.g., tetrahedral elements, two-dimensional elements, etc.). Additionally, whereas three ordered lists are shown for defining a potential neighbor space, two ordered lists can be used for a two-dimensional grid instead. Furthermore, whereas the characteristic length has been shown and described to defined a side length of a cubic space, other quantities of another geometric shape or body can be used, for example, a radius of a sphere as the characteristic length. Finally, whereas, the centroid of an element has been shown and described as a node representing the element for neighborhood determination, other nodes associated with the element may be used instead, for example, any of the corner nodes. In summary, the scope of the invention should not be restricted to the specific exemplary embodiments disclosed herein, and all modifications that are readily suggested to those of ordinary skill in the art should be included within the spirit and purview of this application and scope of the appended claims.

What is claimed is:

1. A method of determining a list of neighbor elements of an element in a grid model, which is used in a computer aided engineering analysis for assisting a user to improve engineering product design, the method comprising:

receiving, in a computer system, a grid model having a plurality of nodes connected by a plurality of elements;

designating one of the elements as a base element;

defining a region containing potential neighbors for the base element, wherein the region comprises a space characterized by respective sets of upper and lower bounds in each dimension of the space, wherein each set of the upper and lower bounds is configured to correlate to a characteristic length centered at a representative node of said base element;

creating a group of potential neighbors of said base element by including those of the elements located within the region;

determining a list of neighbor elements by including only those elements that fit a predefined neighborhood definition from the group of potential neighbors, whereby the list of neighbor elements of said base element is used in conjunction with the grid model in a computer aided engineering analysis for assisting a user to improve engineering product design.

2. The method of claim 1, wherein the characteristic length is assigned by the user.

3. The method of claim 1, wherein the characteristic length is estimated as a particular metric of the grid model.

4. The method of claim 3, wherein the particular metric is a certain multiple of average size of all of the elements in the grid model.

5. The method of claim 3, wherein the particular metric is a fraction of the grid model's size.

6. The method of claim 1, said defining the region containing potential neighbors for the base element further comprises assigning the characteristic length to said base element, wherein the characteristic length is defined by the user and used for establishing the region of potential neighbors.

7. The method of claim 1, wherein said base element comprises a plurality of corner nodes from which the representative node is derived.

8. The method of claim 7, wherein the representative node is defined by a set of coordinates measured in the space.

9. The method of claim 8, wherein each set of the upper and lower bounds are defined by adding and subtracting the characteristic length to and from respective coordinates of the representative node.

10. The method of claim 1, said creating the group of potential neighbors further comprises sorting the elements into a plurality of ordered lists, each for one of respective dimensions of the space and locating particular elements corresponding to the upper and lower bounds in each of the ordered lists to determine a boundary between potential neighbor and non-neighbor.

11. The method of claim 10, wherein said locating particular elements corresponding to the upper and lower bounds is conducted without calculating distance between the base element and a particular one element in each of the ordered lists.

12. The method of claim 1, wherein said predefined neighborhood definition comprises the representative node of the base element and a representative node of each of the neighbor elements are located no farther than the characteristic length.

13. The method of claim 1, wherein the representative node is the base element's centroid.

14. A system for determining a list of neighbor elements of an element in a grid model, which is used in a computer aided engineering analysis for assisting a user to improve engineering product design, the system comprising:
- a main memory for storing computer readable code for an application module;
- at least one processor coupled to the main memory, said at least one processor executing the computer readable code in the main memory to cause the application module to perform operations by a method of:
  - receiving, in the computer system, a grid model having a plurality of nodes connected by a plurality of elements;
  - designating one of the elements as a base element;
  - defining a region containing potential neighbors for the base element, wherein the region comprises a space characterized by respective sets of upper and lower bounds in each dimension of the space, wherein each set of the upper and lower bounds is configured to correlate to a characteristic length centered at representative node of said base element;
  - creating a group of potential neighbors of said base element by including those of the elements located within the region;
  - determining a list of neighbor elements by including only those elements that fit a predefined neighborhood definition from the group of potential neighbors, whereby the list of neighbor elements of said base element is used in conjunction with the grid model in a computer aided engineering analysis for assisting a user to improve engineering product design.

15. A computer recordable storage medium containing instructions for controlling a computer system for determining a list of neighbor elements of an element in a grid model, which is used in a computer aided engineering analysis for assisting a user to improve engineering product design, by a method comprising:
- receiving, in the computer system, a grid model having a plurality of nodes connected by a plurality of elements;
- designating one of the elements as a base element;
- defining a region containing potential neighbors for the base element, wherein the region comprises a space characterized by respective sets of upper and lower bounds in each dimension of the space, wherein each set of the upper and lower bounds is configured to correlate to a characteristic length centered at representative node of said base element;
- creating a group of potential neighbors of said base element by including those of the elements located within the region;
- determining a list of neighbor elements by including only those elements that fit a predefined neighborhood definition from the group of potential neighbors, whereby the list of neighbor elements of said base element is used in conjunction with the grid model in a computer aided engineering analysis for assisting a user to improve engineering product design.

* * * * *